United States Patent
Chiu

(10) Patent No.: US 8,745,546 B2
(45) Date of Patent: Jun. 3, 2014

(54) MASK OVERLAY METHOD, MASK, AND SEMICONDUCTOR DEVICE USING THE SAME

(75) Inventor: Chui-Fu Chiu, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 277 days.

(21) Appl. No.: 13/340,278

(22) Filed: Dec. 29, 2011

(65) Prior Publication Data

US 2013/0168877 A1    Jul. 4, 2013

(51) Int. Cl.
*G06F 17/50* (2006.01)
*G06K 9/00* (2006.01)
*G03C 5/00* (2006.01)

(52) U.S. Cl.
USPC ............... 716/51; 716/50; 382/144; 382/145; 382/151; 430/30

(58) Field of Classification Search
CPC ............... G03F 1/20; G03F 1/38; G03F 1/42; G03F 1/44; G03F 1/144; G06F 17/5068
USPC .......... 716/50–56; 382/144–145, 151; 430/30
See application file for complete search history.

(56) References Cited

U.S. PATENT DOCUMENTS

| | | | |
|---|---|---|---|
| 6,699,624 B2* | 3/2004 | Niu et al. | 430/5 |
| 7,732,105 B2* | 6/2010 | Yoo et al. | 430/5 |
| 8,501,376 B2* | 8/2013 | Hung et al. | 430/30 |
| 8,535,858 B2* | 9/2013 | Chiu | 430/22 |
| 2003/0223630 A1* | 12/2003 | Adel et al. | 382/145 |
| 2004/0137341 A1* | 7/2004 | Niu et al. | 430/5 |
| 2004/0169861 A1 | 9/2004 | Mieher et al. | |
| 2005/0240895 A1* | 10/2005 | Smith et al. | 716/19 |
| 2005/0244729 A1* | 11/2005 | Liu et al. | 430/30 |
| 2006/0080046 A1* | 4/2006 | Ziger et al. | 702/32 |
| 2006/0209276 A1 | 9/2006 | Smith et al. | |
| 2007/0099098 A1* | 5/2007 | Tsai | 430/22 |
| 2007/0196744 A1* | 8/2007 | Hennig et al. | 430/5 |
| 2008/0057418 A1* | 3/2008 | Seltmann et al. | 430/30 |
| 2009/0004880 A1* | 1/2009 | Li et al. | 438/761 |
| 2010/0209830 A1* | 8/2010 | Carcasi et al. | 430/30 |
| 2011/0299759 A1* | 12/2011 | Shi et al. | 382/144 |
| 2012/0308788 A1* | 12/2012 | Chiu et al. | 428/201 |
| 2013/0164689 A1* | 6/2013 | Chiu | 430/323 |

FOREIGN PATENT DOCUMENTS

| | | |
|---|---|---|
| JP | 2006-518942 A | 8/2006 |
| TW | 200710613 A | 3/2007 |

* cited by examiner

*Primary Examiner* — Stacy Whitmore

(57) ABSTRACT

A mask overlay method, and a mask and a semiconductor device using the same are disclosed. According to the disclosed mask overlay technique, test marks and front layer overlay marks corresponding to a plurality of overlay mark designs are generated in a first layer of a semiconductor device. The test patterns generating the test marks each include a first sub pattern and a second sub pattern. Note that the first sub pattern has the same design as a front layer overlay pattern (which generates the front layer overlay mark corresponding thereto). Based on the test marks, performances of the plurality of overlay mark designs are graded. The front layer overlay mark corresponding to the overlay mark design having the best performance is regarded as an overlay reference for a mask of a second layer of the semiconductor device.

13 Claims, 8 Drawing Sheets

MASK OVERLAY METHOD, MASK, AND SEMICONDUCTOR DEVICE USING THE SAME

BACKGROUND OF THE INVENTION

1. Field of the Invention

The present invention relates to mask overlay technologies for semiconductor processing.

2. Description of the Related Art

When making a semiconductor device, overlay marks are required at different layers of the semiconductor device. The overlay of a mask of a current layer is accomplished by aligning a current layer overlay pattern provided on the mask to a front layer overlay mark that has been manufactured within a front layer. The information about the center of the front layer overlay mark is required in mask overlay.

However, the front layer overlay mark may have a non-ideal shape. For example, depending on the semiconductor processes of the front layer, the front layer overlay mark may have damaged edges (referring to FIG. 1A) or be covered by an uneven film (referring to FIG. 1B). The damaged edges or the uneven film may considerably affect the accuracy of the center information about the front layer overlay mark. As shown in FIG. 1A or FIG. 1B, the obtained center deviates from the real center of the front layer overlay mark by a distance $\Delta x$. The error ($\Delta x$) of the center information seriously affects the mask overlay.

BRIEF SUMMARY OF THE INVENTION

A mask overlay method, and a mask and a semiconductor device using the same are disclosed.

A mask overlay method in accordance with an exemplary embodiment of the invention is detailed below. According to the disclosed method, test marks corresponding to a plurality of overlay mark designs are generated in a first layer of a semiconductor device. The test marks are generated according to test patterns. Each test pattern comprises a first sub pattern and a second sub pattern. Further, according to the disclosed method, front layer overlay marks corresponding to the plurality of overlay mark designs are generated in the first layer of the semiconductor device as well. The front layer overlay marks are generated according to front layer overlay patterns. For the same overlay mark design, the front layer overlay pattern has the same design as the first sub pattern. Based on the test marks, performances of the plurality of overlay mark designs are graded. The front layer overlay mark corresponding to the overlay mark design having the best performance is regarded as an overlay reference for a mask of a second layer of the semiconductor device.

A mask in accordance with an exemplary embodiment of the invention comprises test patterns and front layer overlay patterns corresponding to a plurality of overlay mark designs. Each test pattern comprises a first sub pattern and a second sub pattern. For the same overlay mark design, the front layer overlay pattern has the same design as the first sub pattern. The test patterns are for generating test marks in a first layer of a semiconductor device, to grade performances of the plurality of overlay mark designs. The front layer overlay patterns are for generating front layer overlay marks in the first layer of the semiconductor device. The front layer overlay marks are candidates for an overlay reference which is referred to by another mask for generating a second layer of the semiconductor device. The front layer overlay mark corresponding to the overlay mark design having the best performance is regarded as the overlay reference.

A semiconductor device in accordance with an exemplary embodiment of the invention comprises test marks and front layer overlay marks in a first layer of the semiconductor device. The test marks correspond to a plurality of overlay mark designs and are generated according to test patterns. Each test pattern comprises a first sub pattern and a second sub pattern. The front layer overlay marks correspond to the plurality of overlay mark designs and are generated according to front layer overlay patterns. For the same overlay mark design, the front layer overlay pattern has the same design as the first sub pattern. The test marks are for grading performances of the plurality of overlay mark designs. The front layer overlay marks are candidates for an overlay reference which is referred to by a mask of a second layer of the semiconductor device. The front layer overlay mark corresponding to the overlay mark design having the best performance is regarded as the overlay reference.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1A:
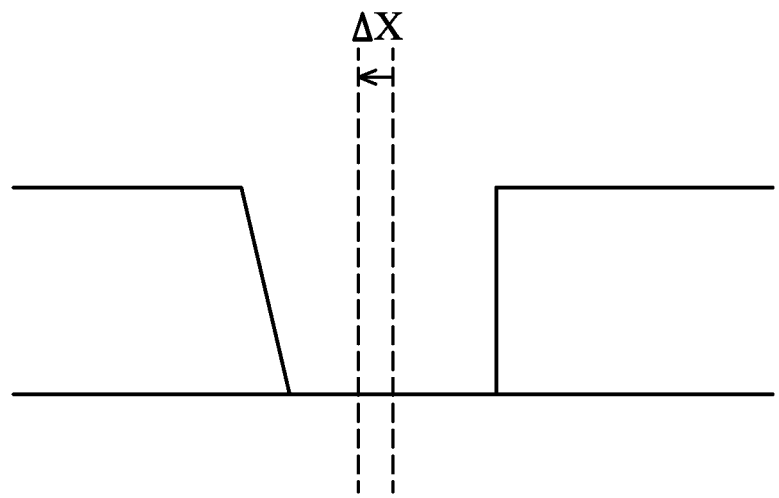
FIG. 1A shows a front layer overlay mark having a damaged edge.
Figure 1B:
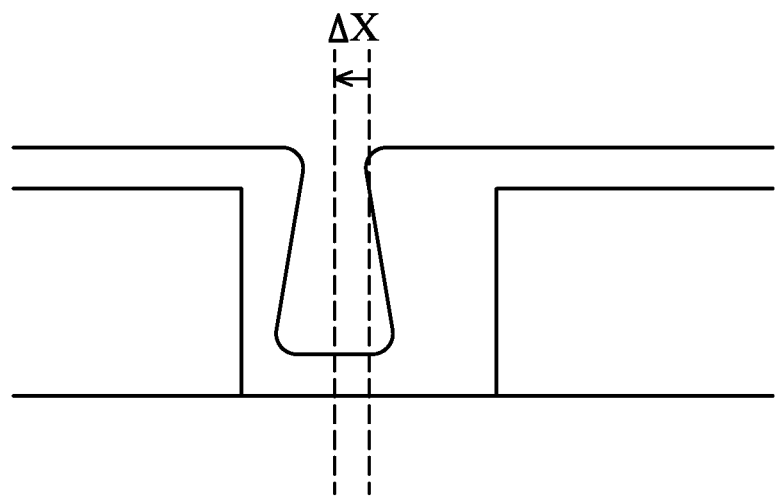
FIG. 1B shows a front layer overlay mark covered by an uneven film.

To remove the center deviation ($\Delta x$ of FIGS. 1A and 1B) caused by the semiconductor processes, a mask overlay method is introduced in the application. And, a mask for implementing the mask overlay method and a semiconductor device produced by using the mask overlay method are shown.

A mask overlay method in accordance with an exemplary embodiment of the invention is detailed below. According to the disclosed method, test marks corresponding to a plurality of overlay mark designs are generated in a first layer of a semiconductor device. The test marks are generated according to test patterns. Each test pattern comprises a first sub pattern and a second sub pattern. Further, according to the disclosed method, front layer overlay marks corresponding to the plurality of overlay mark designs are generated in the first layer of the semiconductor device as well. The front layer overlay marks are generated according to front layer overlay patterns. For the same overlay mark design, the front layer overlay pattern has the same design as the first sub pattern. Based on the test marks, performances of the plurality of overlay mark designs are graded. The front layer overlay mark corresponding to the overlay mark design having the best performance is regarded as an overlay reference for a mask of a second layer of the semiconductor device.

A mask in accordance with an exemplary embodiment of the invention comprises the test patterns and the front layer overlay patterns.

A semiconductor device in accordance with an exemplary embodiment of the invention comprises the test marks and the front layer overlay marks.

Figure 2A:
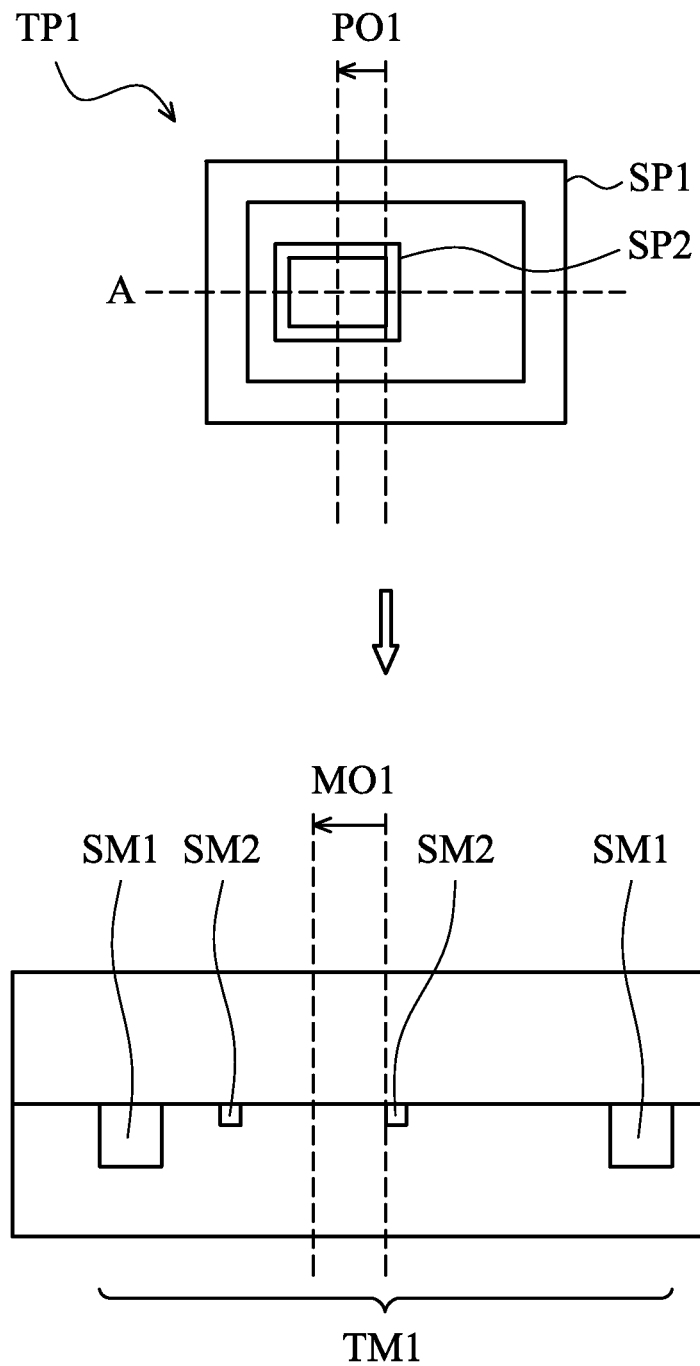
FIGS. 2A, 2B and 2C show the at least three test patterns TP1, TP2 and TP3 for one specific overlay mark design and the three test marks TM1, TM2 and TM3 (shown by cross sections across line A) generated accordingly.
Figure 2B:
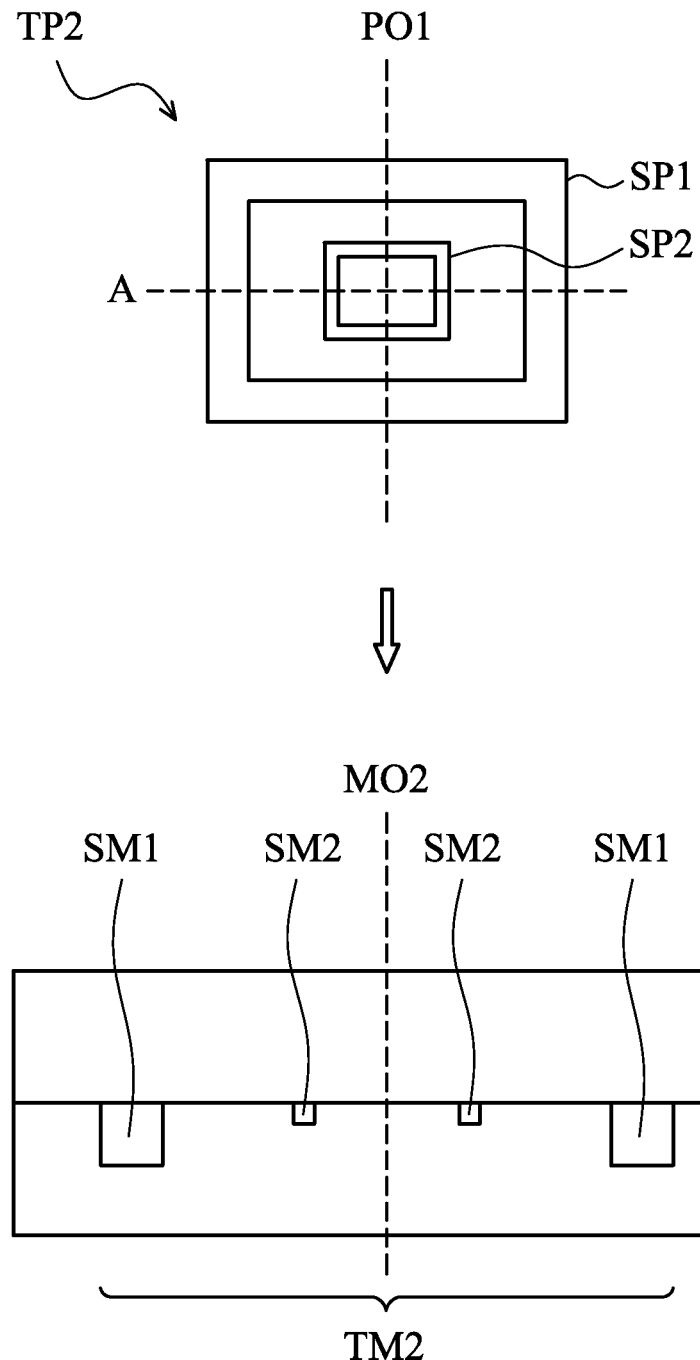
Figure 2C:
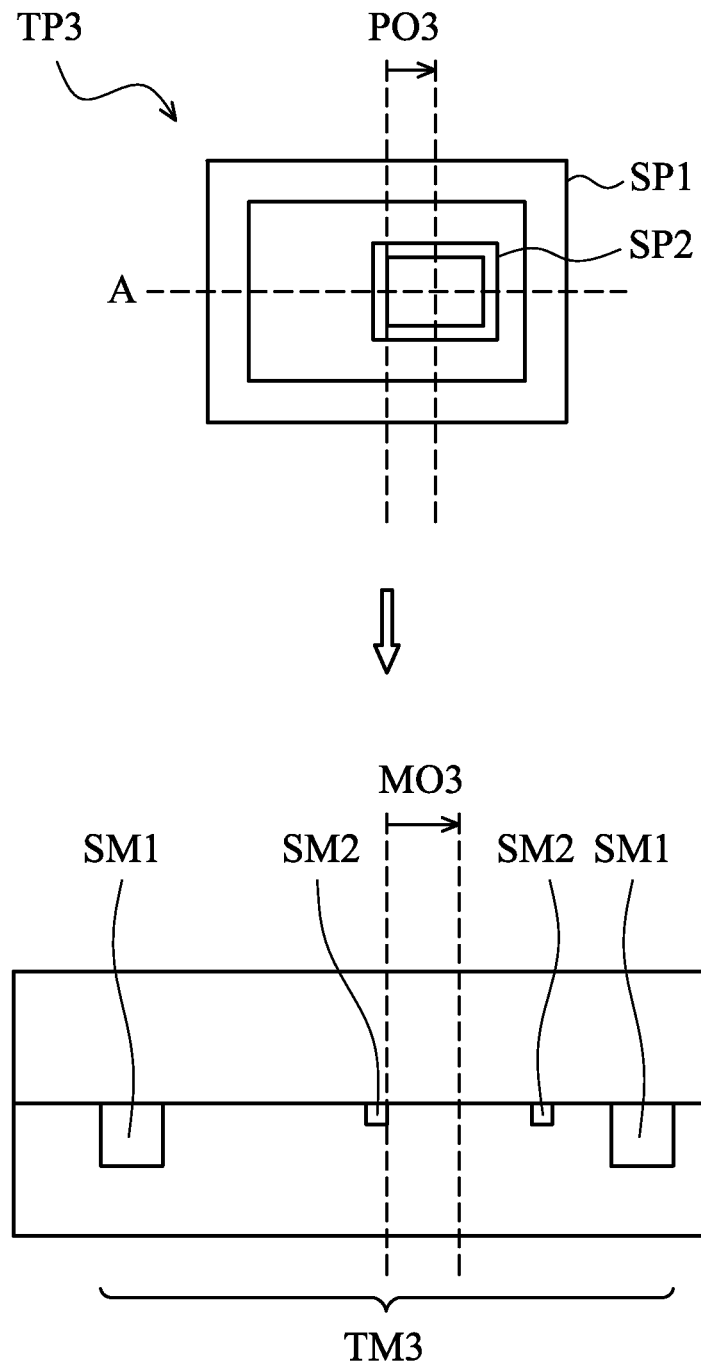

The plurality of overlay mark designs are provided by changing the bar width or pattern shape or both. The performance of the different overlay mark designs may be graded by several methods. In an exemplary embodiment, each overlay mark design is provided with at least three test patterns. The at least three test patterns have different pattern offsets between the first and second sub patterns. FIG. 2A, FIG. 2B and FIG. 2C show the at least three test patterns TP1, TP2 and TP3 for one specific overlay mark design and the three test marks TM1, TM2 and TM3 (shown by cross sections across line A) generated accordingly.

As shown, each test pattern (TP1 or TP2 or TP3) comprises a first sub pattern SP1 and a second sub pattern SP2 and, accordingly, the generated test mark (TM1 or TM2 or TM3) comprises a first sub mark (indicated by SM1, generated according to the first sub pattern SP1) and a second sub mark SM2 (generated according to the second sub pattern SP2). The first sub patterns SP1 of the test patterns TP1, TP2 and TP3 are of identical design—having the same bar width and shape. The second sub patterns SP2 of the test patterns TP1, TP2 and TP3 are of identical design—having the same bar width and shape. The design of the first sub patterns SP1 is further used in manufacturing front layer overlay marks for mask overlay. The design of the second sub patterns SP2 is further used in manufacturing current layer overlay patterns for mask overlay. The design of the first and second sub patterns SP1 and SP2 form the specific overlay mark design.

Referring to the test pattern TP1 of FIG. 2A, there is a pattern offset PO1 between the first sub pattern SP1 and the second sub pattern SP2. Referring to the test pattern TP2 of FIG. 2B, there is a pattern offset PO2 between a first sub pattern SP1 and a second sub pattern SP2. Referring to the test pattern TP3 of FIG. 2C, there is a pattern offset PO3 between a first sub pattern SP1 and a second sub pattern SP2. The values of the pattern offsets PO1 and PO2 and PO3 are different. In FIG. 2A, the center of the second sub pattern SP2 deviates to the left of the center of the first sub pattern SP1 by the pattern offset PO1. In FIG. 2B, the pattern offset PO2 is zero, so the center of the second sub pattern SP2 overlaps with the center of the first sub pattern SP1. In FIG. 2C, the center of the second sub pattern SP2 deviates to the right of the center of the first sub pattern SP1 by the pattern offset PO3. The pattern offsets PO1, PO2 and PO3 should be reflected in mark offsets MO1, MO2 and MO3 between the first and second sub marks of the test marks (e.g., between SM1 and SM2 of TM1, between SM1 and SM2 of TM2, and between SM1 and SM2 of TM3). According to the disclosed techniques, the mark offsets MO1, MO2 and MO3 are measured to be compared with the pattern offsets PO1, PO2 and PO3 and thereby linearity between the mark offsets MO1, MO2 and MO3 and the pattern offsets PO1, PO2 and PO3 is evaluated for the specific overlay mark design discussed in FIGS. 2A, 2B and 2C.

In a perfect overlay mark design, the mark offsets should be equal to the pattern offsets, i.e., MO1=PO1, MO2=PO2 and MO3=PO3, and so that the perfect overlay mark design is considered as having high linearity. Between different overlay mark designs, the overlay mark design having the highest linearity is graded as having the best performance, and the design of the first sub patterns SP1 corresponding thereto is suitable to form front layer overlay marks for mask overlay while the design of the second sub patterns SP2 corresponding thereto is suitable to form current layer overlay patterns for mask overlay. Thus, the front layer overlay mark that has been generated in the same layer with the test marks and corresponds to the best overlay mark design is regarded as the overlay reference for the subsequent mask.

Figure 3A:
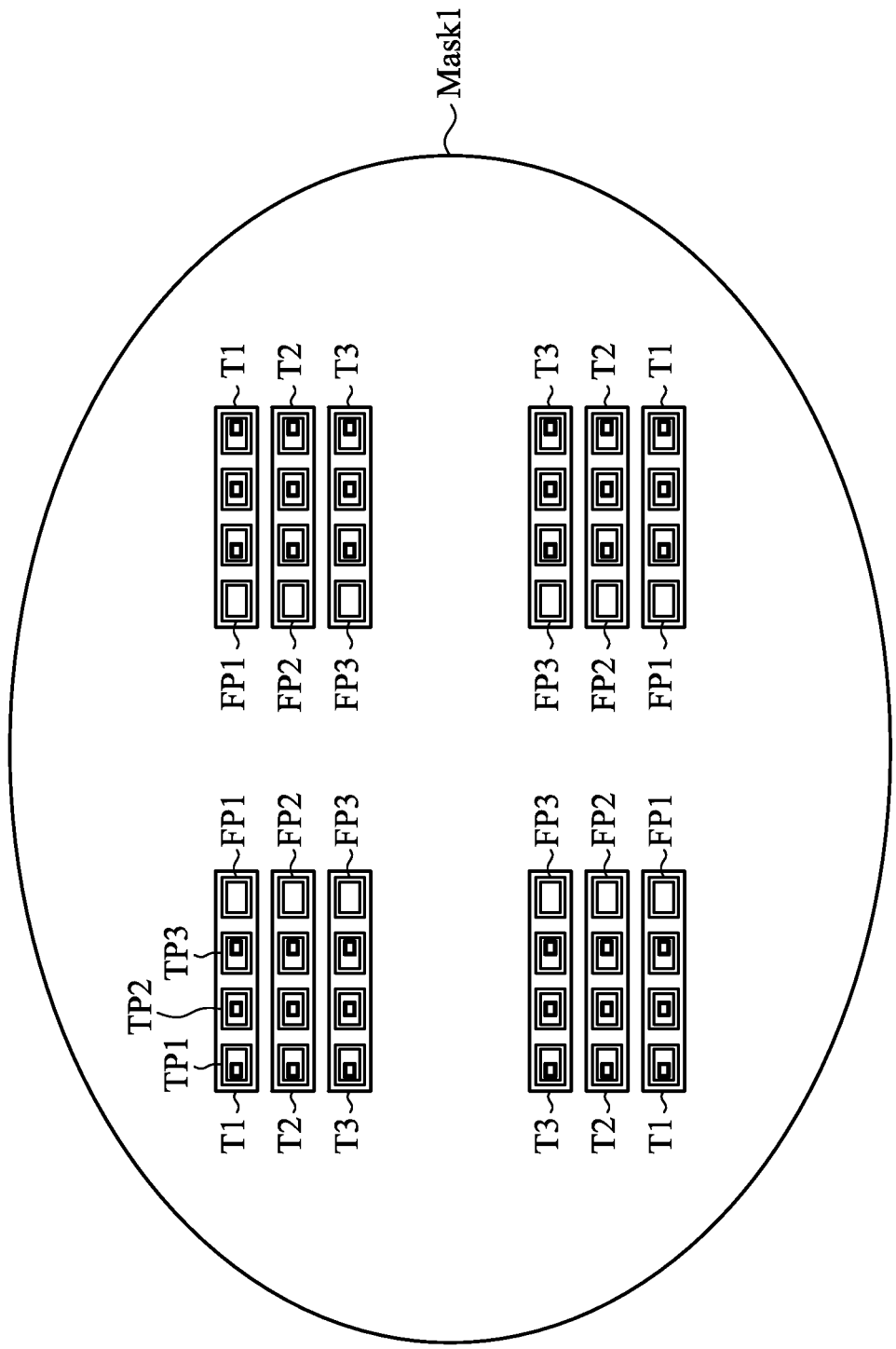
FIG. 3A and FIG. 3B depict masks Mask1 and Mask2, respectively, for generating a first layer and a second layer of a semiconductor device.
Figure 3B:
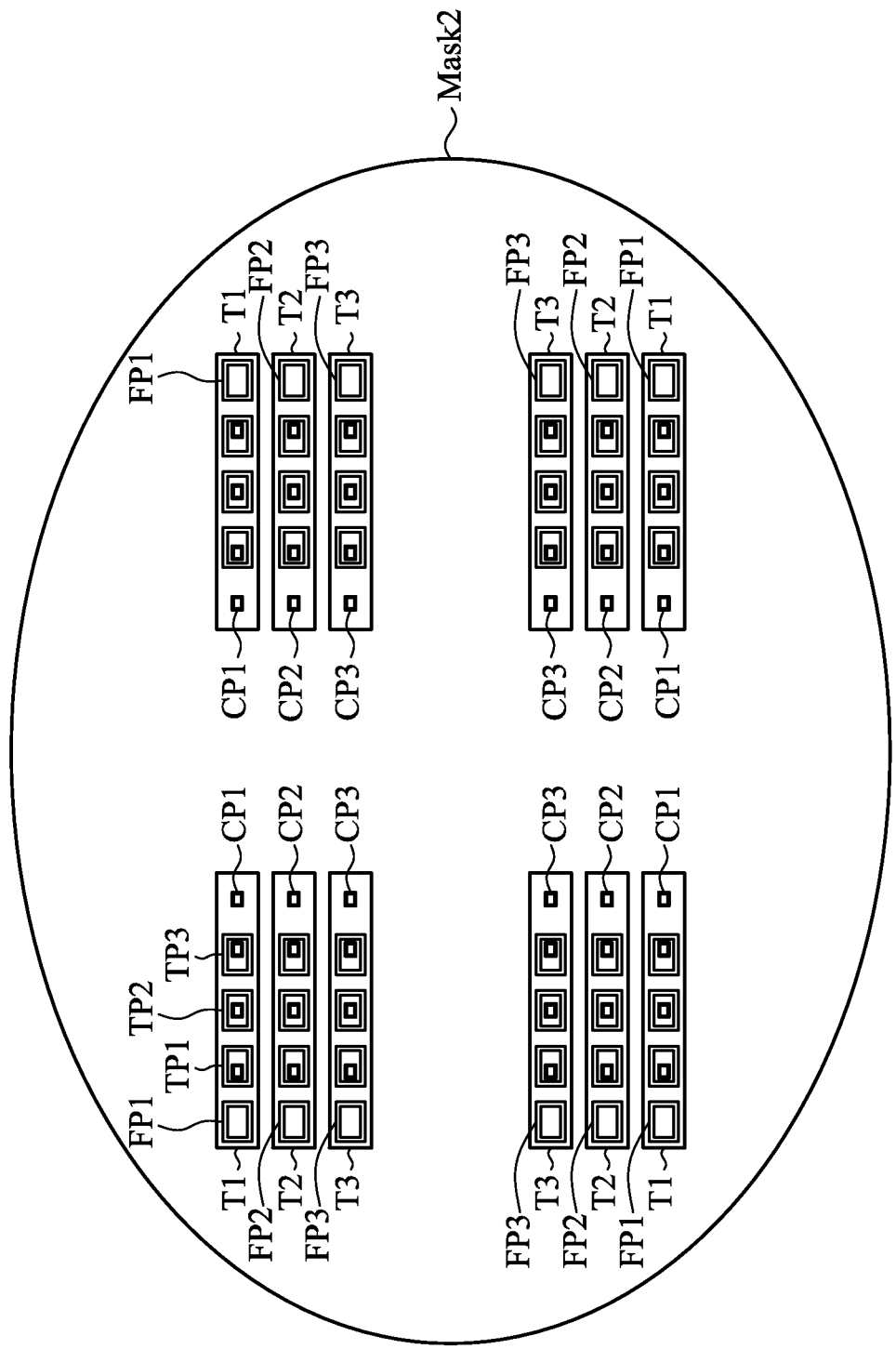

FIG. 3A depicts a mask Mask1 for generating a first layer of a semiconductor device while FIG. 3B depicts another mask Mask2 for generating a second layer of the semiconductor device. The disclosed overlay design is placed in four corners of the masks Mask1 and Mask2. For simplicity, only the design in one corner is discussed.

In the exemplary embodiment shown in FIGS. 3A and 3B, there are three different overlay mark designs: T1, T2 and T3. Test patterns TP1, TP2 and TP3 (referring to FIGS. 2A-2C, having different pattern offsets PO1, PO2 and PO3) are provided for each overlay mark design (T1 or T2 or T3). Further, the mask pattern further contains front layer overlay patterns FP1, FP2 and FP3 corresponding to the different overlay mask designs T1, T2 and T3. Note that for each overlay mark design the front layer overlay pattern corresponding thereto has the same design as the first sub patterns of the test patterns.

In the mask Mask2, the current layer overlay patterns CP1, CP2 and CP3 corresponding to the different overlay mark designs T1, T2 and T3 are further provided thereon, aligned to the front layer overlay patterns FP1, FP2 and FP3 in the mask Mask1. Note that for each overlay mark design the current layer overlay pattern has the same design as the second sub patterns of the test patterns. As for the test patterns TP1, TP2 and TP3 and the front layer overlay patterns FP1, FP2 and FP3 provided on the mask Mask2, they are for evaluating the best overlay mark design suitable to the processes of the second layer.

Figure 4:
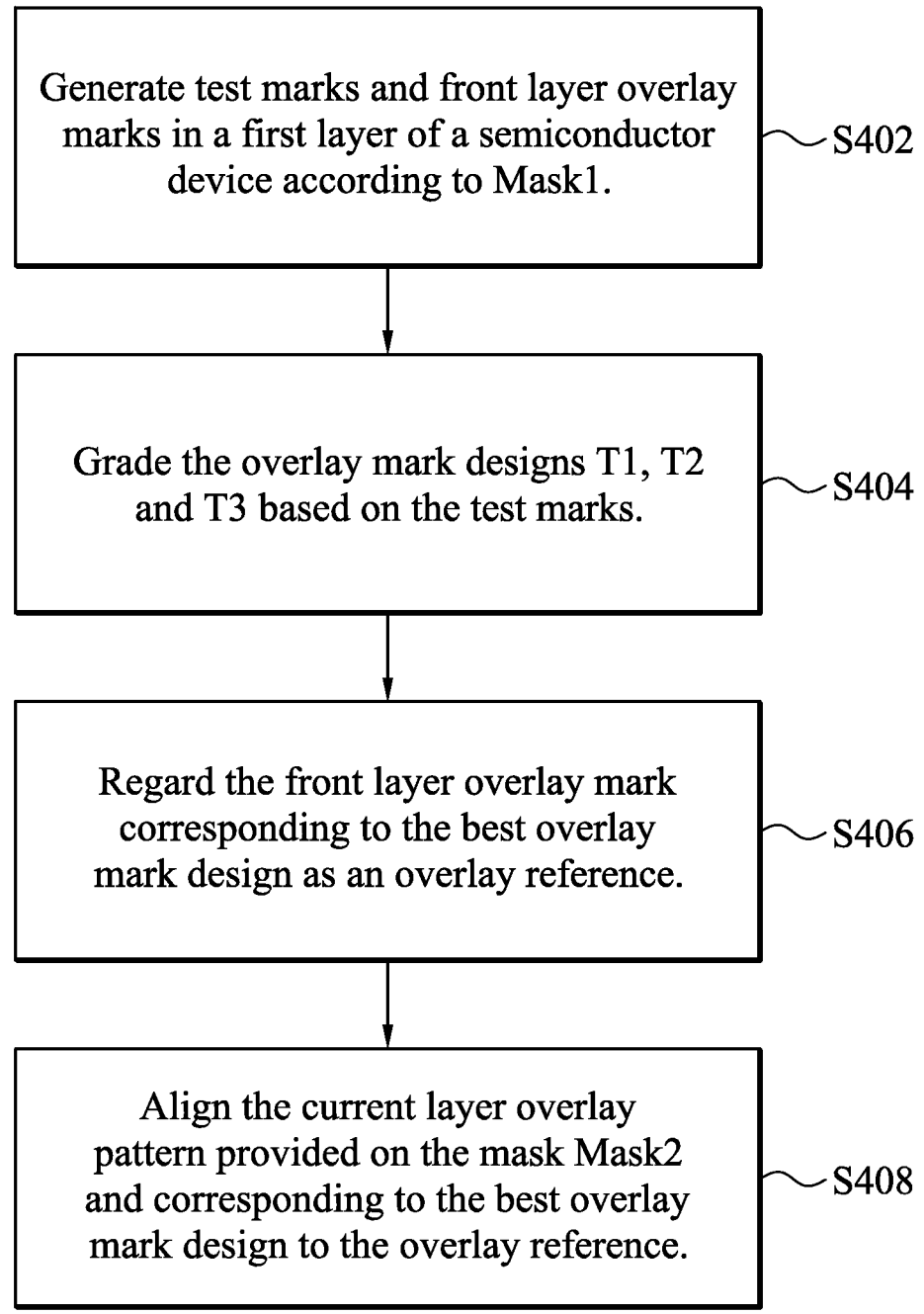
FIG. 4 is a flowchart depicting the overlay of the mask Mask2.

FIG. 4 is a flowchart depicting the overlay of the mask Mask2. In step S402, test marks and front layer overlay marks are generated in the first layer of the semiconductor device according to the mask Mask1. In step S404, the overlay mark designs T1, T2 and T3 are graded based on the test marks. In step S406, the front layer overlay mark corresponding to the best overlay mark design is regarded as an overlay reference. In step S408, the current layer overlay pattern provided on the mask Mask2 and corresponding to the best overlay mark design is aligned to the overlay reference and thereby the mask Mask2 is correctly aligned to the semiconductor device under processing.

Figure 5:
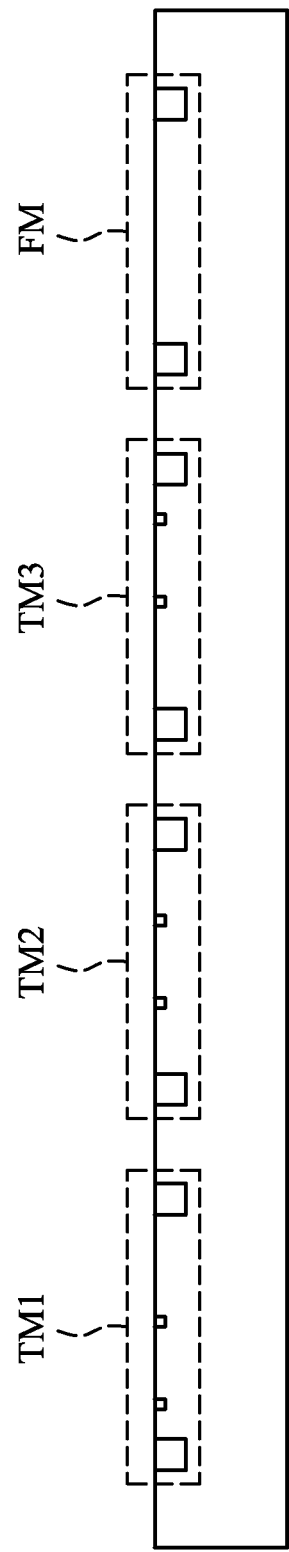
FIG. 5 shows a cross section of a layer of a semiconductor device manufactured with the disclosed mask overlay technique.

FIG. 5 shows a cross section of a layer of a semiconductor device using the mask overlay technique, which contains test marks TM1, TM2 and TM3 (referring to FIGS. 2A-2C) and a front layer overlay mark FM corresponding to one specific overlay mark design. In addition to the marks shown in the cross section, this layer further contains test marks and front layer overlay marks corresponding to other overlay mark designs over the entire layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask overlay method for semiconductor processing, comprising:
   generating test marks corresponding to a plurality of overlay mark designs in a first layer of a semiconductor device, wherein the test marks are generated according to test patterns and each test pattern comprises a first sub pattern and a second sub pattern;
   generating front layer overlay marks corresponding to the plurality of overlay mark designs in the first layer of the semiconductor device, wherein the front layer overlay marks are generated according to front layer overlay patterns, and, each front layer overlay pattern has the same design as the first sub pattern corresponding thereto;
   grading performances of the plurality of overlay mark designs based on the test marks; and
   regarding the front layer overlay mark corresponding to the overlay mark design having the best performance as an overlay reference for a mask of a second layer of the semiconductor device.

2. The mask overlay method as claimed in claim 1, wherein, for each overlay mark design, the lowest amount of the test patterns corresponding thereto is three and the at least three test patterns have different pattern offsets between the first and second sub patterns.

3. The mask overlay method as claimed in claim 2, comprising:
   measuring mark offsets between first and second sub marks of the test marks, wherein the first sub marks are generated according to the first sub patterns while the second sub marks are generated according to the second sub patterns;
   evaluating linearity, for each overlay mark design, between the mark offsets and the pattern offsets; and
   grading the overlay mark design having the highest linearity as the overlay mark design having the best performance.

4. The mask overlay method as claimed in claim 1, further comprising:
   providing current layer overlay patterns of the plurality of overlay mark designs on the mask of the second layer of the semiconductor device, wherein each current layer overlay pattern has the same design as the second sub pattern corresponding thereto; and
   using the current layer overlay pattern corresponding to the overlay mark design having the best performance to align the front layer overlay mark which is regarded as the overlay reference.

5. The mask overlay method as claimed in claim 1, wherein the plurality of overlay mark designs are provided by changing the bar width or pattern shape or both.

6. A mask for semiconductor processing, comprising:
   test patterns corresponding to a plurality of overlay mark designs, wherein each test pattern comprises a first sub pattern and a second sub pattern; and
   front layer overlay patterns corresponding to the plurality of overlay mark designs, wherein each front layer overlay pattern has the same design as the first sub pattern corresponding thereto,
   wherein:
   the test patterns are for generating test marks in a first layer of a semiconductor device, for grading performances of the plurality of overlay mark designs; and
   the front layer overlay patterns are for generating front layer overlay marks in the first layer of the semiconductor device, as candidates for an overlay reference which is referred to by another mask for generating a second layer of the semiconductor device, and, the front layer overlay mark corresponding to the overlay mark design having the best performance is regarded as the overlay reference.

7. The mask as claimed in claim 6, wherein, for each overlay mark design, the lowest amount of the test patterns corresponding thereto is three and the at least three test patterns have different pattern offsets between the first and second sub patterns.

8. The mask as claimed in claim 6, wherein:
   mark offsets between first and second sub marks of the test marks and the pattern offsets between the first and second sub patterns of the test patterns are used in evaluating linearity of each overlay mark design, wherein the first sub marks are generated according to the first sub patterns while the second sub marks are generated according to the second sub patterns; and
   the overlay mark design having the highest linearity is graded as the overlay mark design having the best performance.

9. The mask as claimed in claim 6, wherein the plurality of overlay mark designs are provided by changing the bar width or pattern shape or both.

10. A semiconductor device, comprising:
    test marks in a first layer of the semiconductor device, wherein the test marks correspond to a plurality of overlay mark designs and are generated according to test patterns, and, each test pattern comprises a first sub pattern and a second sub pattern;
    front layer overlay marks in the first layer of the semiconductor device, wherein the front layer overlay marks correspond to the plurality of overlay mark designs and are generated according to front layer overlay patterns, and, each front layer overlay pattern has the same design as the first sub pattern corresponding thereto;
    wherein:
    the test marks are for grading performances of the plurality of overlay mark designs; and
    the front layer overlay marks are candidates for an overlay reference which is referred to by a mask of a second layer of the semiconductor device, and, the front layer overlay mark corresponding to the overlay mark design having the best performance is regarded as the overlay reference.

11. The semiconductor device as claimed in claim 10, wherein, for each overlay mark design, the lowest amount of the test marks corresponding thereto is three and the test patterns for the at least three test marks have different pattern offsets between the first and second sub patterns.

12. The semiconductor device as claimed in claim 11, wherein:
    mark offsets between first and second sub marks of the test marks and the pattern offsets between the first and second sub patterns of the test patterns are used in evaluating linearity of each overlay mark design, wherein the first sub marks are generated according to the first sub patterns while the second sub marks are generated according to the second sub patterns; and
    the overlay mark design having the highest linearity is graded as the overlay mark design having the best performance.

13. The semiconductor as claimed in claim 12, wherein the plurality of overlay mark designs are provided by changing the bar width or pattern shape or both.

* * * * *